United States Patent
Engelahardt

(10) Patent No.: US 6,915,400 B2
(45) Date of Patent: Jul. 5, 2005

(54) MEMORY ACCESS COLLISION AVOIDANCE SCHEME

(75) Inventor: Markus Engelahardt, Dettingen-Teck (DE)

(73) Assignee: Dialog Semiconductor GmbH, Kirchheim/Teck-Nabern (DE)

(*) Notice: Subject to any disclaimer, the term of this patent is extended or adjusted under 35 U.S.C. 154(b) by 232 days.

(21) Appl. No.: 10/277,066

(22) Filed: Oct. 21, 2002

(65) Prior Publication Data

US 2004/0068633 A1 Apr. 8, 2004

(30) Foreign Application Priority Data

Oct. 2, 2002 (EP) .............................................. 02368107

(51) Int. Cl.[7] .............................................. G06F 12/00
(52) U.S. Cl. ....................... 711/167; 711/104; 711/168; 711/150; 365/230.05
(58) Field of Search ................................ 711/167, 104, 711/168, 154, 149, 150; 365/230.05; 710/61; 713/400, 500, 502, 600

(56) References Cited

U.S. PATENT DOCUMENTS

| | | | | |
|---|---|---|---|---|
| 5,001,671 A | | 3/1991 | Koo et al. ............. | 365/230.05 |
| 5,761,147 A | | 6/1998 | Lindner et al. ........ | 365/230.05 |
| 5,781,480 A | * | 7/1998 | Nogle et al. ........... | 365/189.04 |
| 5,974,482 A | | 10/1999 | Gerhart ................... | 710/52 |
| 6,134,154 A | | 10/2000 | Iwaki et al. ............ | 365/189.04 |
| 6,144,604 A | * | 11/2000 | Haller et al. .............. | 365/221 |
| 6,259,648 B1 | * | 7/2001 | Kragick ................... | 365/230.05 |
| 6,314,047 B1 | | 11/2001 | Keay et al. ............. | 365/230.05 |
| 6,430,088 B1 | * | 8/2002 | Plants et al. ........... | 365/189.04 |
| 6,459,650 B1 | | 10/2002 | Lin ............................ | 365/233 |

FOREIGN PATENT DOCUMENTS

JP 06161870 6/1994 ........... G06F/12/00

OTHER PUBLICATIONS

Otomo, et al., "Special Memory and Embedded Memory Macros in MPEG Environment (Invited)", © 1995 IEEE, p. 139–142.*

Nicula, "VHDL Model of High–Speed Single–Port RAM (Synchronous Type)", © 1998 OPTIM, p. 1–4.*

* cited by examiner

*Primary Examiner*—Donald Sparks
*Assistant Examiner*—Brian R. Peugh
(74) *Attorney, Agent, or Firm*—George O. Saile; Stephen B. Ackerman

(57) ABSTRACT

A method and a circuit for avoiding memory access collisions during asynchronous read-write access to a single-port RAM (SPRAM) are described. Serial write access by means of a serial interface and read access with a read strobe from an independent read device are generated asynchronously. Prerequisites for the implementation are: firstly, use of a serial interface providing a serial clock signal; secondly, write access to SPRAM has to occur at the end of serial transmission; thirdly, a write strobe impulse has to be short compared to the original read strobe. Energy saving is achieved by guaranteeing only one regular read strobe, even when multiple write accesses occur during one read access. The read strobe signal can therefore be used also for control of an LCD backplane counter.

37 Claims, 10 Drawing Sheets

MEMORY ACCESS COLLISION AVOIDANCE SCHEME

BACKGROUND OF THE INVENTION (1) Field of the Invention

The invention relates generally to data storage in semiconductor memory devices, and more particularly, to Random Access Memory (RAM) devices within Liquid Crystal Display (LCD) interface circuits with asynchronous, collision free read and write data access thereto, during simultaneous transmission of serial data input.

(2) Description of the Prior Art

Graphical LCD displays such as those used e.g. on mobile information terminals etc. need a specific controller circuit for their proper operation. Such LCD controllers are used to control the operation of the LCD display and supply the display drivers with appropriate data. An important feature of these LCD display interfaces is the use of RAM for data storage purposes. It is also well known to employ LCD controllers with asynchronous serial data input. A common problem, which must be overcome in such an LCD interface, is the possibility of simultaneous read-write access to the same data RAM, because the LCD controller reads data periodically and completely unaware of the randomly incoming serial data. With commercially available LCD interface chips the problem of asynchronous read and write access to RAM usually is solved utilizing Dual-Port RAM (DPRAM) or Single-Port RAM (SPRAM) in conjunction with additional output buffers.

Asynchronous signifies in this context, that read and write accesses to RAM may occur independently in time i.e. asynchronously to each other. Therefore, it is necessary to avoid collisions of data access in time, which would in consequence lead to corrupted data in RAM. Generally used thereby, for well-known technical reasons, is Static RAM (SRAM).

In the current art, there are two techniques for guaranteeing valid, non-corrupted data in SRAM. In the first technique, a Dual-Port SRAM (DPRAM) is employed. This approach has the advantage of a simple straightforward design, since input ports and output ports a strictly separated, i.e. even simultaneous read-write access does not lead to corrupted data in memory. Unfortunately, the internal chip structure is somewhat more complex and thus requires a larger amount of chip area. The second technique uses Single-Port SRAM (SPRAM) with buffered output. However, this solution requires one additional data register for each data line. It would be advantageous to utilize the simpler SPRAM instead of DPRAM and avoid data access collisions by some other means instead of additional buffering. Considerations made in connection with SPRAM use furnished some interesting solutions until now, but none of which took the onset presented here.

Several prior art inventions describe means/methods for avoidance of data access collisions at SPRAM use.

U.S. Pat. No. 5,974,482 to Gerhart describes a single-port first-in-first-out device having an overwrite protection capability. The FIFO device includes a single-port memory for storing data from a host processor. The single-port memory is addressed in a sequential and non-random manner. Control circuitry coupled to the counter and the memory allows for the reading/writing of host data from/to the single-port memory. Write protect circuitry prevents host writes to the single-port memory by entering a write protect state.

U.S. Pat. No. 6,314,047 to Keay et al. shows a low cost alternative to a large DPRAM using a wrapper of logic surrounding a conventional single-port static memory function, thus a single-port random access memory structure enclosed within the wrapper provides the functional throughput advantage that only a dual-port memory device would otherwise make possible.

U.S. Pat. No. 5,761,147 to Lindner et al. discloses a virtual two-port memory structure with fast write-through operation, where the virtual two-port memory structure employs a SPRAM cell.

SUMMARY OF THE INVENTION

A principal object of the present invention is to provide an effective and very manufacturable method and circuit for avoiding memory access collisions during read and write operations to a single-port RAM, comprising serial write access by means of a serial interface and simultaneous read access by means of an independent read device.

A further object of the present invention is to make direct use of the serial interface signals serial clock and/or write strobe for the method and circuit of the invention.

A still further object of the present invention is to use an ordinary LCD controller circuit as independent read device using the original read strobe signal of this LCD controller.

A still further object of the present invention is to reduce the power consumption of the circuit during operation, i.e. saving energy.

Yet another still further object of the present invention is to use the modified resulting read strobe signal as an input signal for the backplane counter of the LCD controller.

In accordance with the objects of this invention, a method for avoiding memory access collisions during read and write operations to a single-port RAM is achieved by controlling the timing of an original read strobe signal of the independent read device, now in dependency of the serial clock signal for the serial interface used for data input via serial write access, generating thus a new modified resulting read strobe signal.

Further in accordance with the objects of this invention, a new Read Access Controller (RAC) circuit is achieved, which implements the method of the invention. The circuit uses as input signals firstly the serial clock and write strobe signals from the serial interface and secondly the original read strobe signal from the read device, thus generating the new modified resulting read strobe signal.

Also in accordance with the objects of this invention, the method and circuit achieved is applicable to and employable with ordinary LCD controller circuits.

Also in accordance with the objects of this invention, a method for reducing power consumption is achieved by generating only one single resulting read strobe signal for every original read strobe signal applied even when multiple write accesses occur.

Also in accordance with the objects of this invention, the method and circuit achieved allows to use the modified resulting read strobe signal as input signal for the backplane counter of an LCD controller by generating only one single resulting read strobe signal for every read cycle.

BRIEF DESCRIPTION OF THE DRAWINGS

In the accompanying drawings forming a material part of this description, the details of the invention are shown.

DESCRIPTION OF THE PREFERRED EMBODIMENTS

The preferred embodiments disclose a novel circuit and method for the avoidance of memory access collisions normally encountered with simultaneous access to RAM within LCD controllers, where a single-port RAM (SPRAM) on an LCD driver chip is read out periodically and write operations access the SPRAM asynchronously via a serial interface. Introducing a novel SPRAM Read Access Controller (RAC) circuit and method by the present invention, read-write access collisions can be avoided under all circumstances. It should be clear to those experienced in the art that the present invention can be applied and extended without deviating from the scope of the present invention.

Figure 1A:
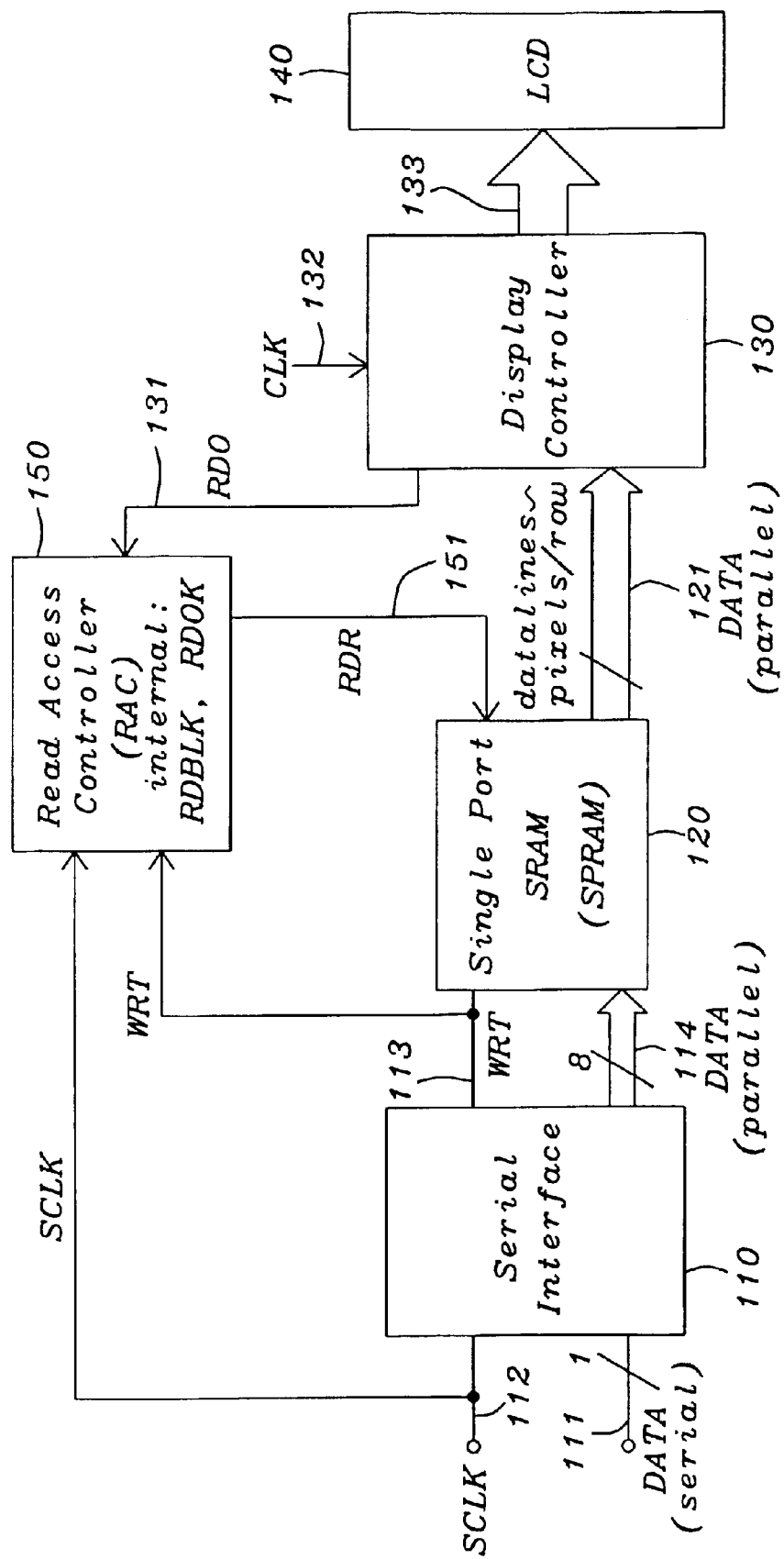
FIG. 1A depicts, in the form of a functional block diagram, the primary circuit elements of the preferred embodiment of the present invention.

Referring now to FIG. 1A, the preferred embodiment of the circuit of the present invention is depicted. When newly introduced, relevant signal name abbreviations used in the figures are shown in parenthesis. A serial interface device 110 with clock input terminal and line 112 and accompanying data input terminal and line 111 receives serial input data (DATA), serially clocked-in by means of the serial clock signal (SCLK) at terminal 112. The interface 110 has a write strobe output signal line 113 and a data output line 114. At the last bit of input data received a write strobe impulse (WRT) is generated. This write strobe impulse initiates the write action and the data are then output in parallel and written to the connected SPRAM device 120; depicted in unidirectional form, i.e. with separated data-in line 114 and data-out line 121, which nevertheless internally writes to and reads from the same storage location, thus representing only a single port. The display controller 130, which is furnishing display data and necessary control signals 133 for the LCD display 140, reads data periodically at line 121 from SPRAM. Usually these data are directly strobed in by a read data signal (RDO) at terminal 131—as can be clearly understood from FIG. 1B and the explanations thereof. In the display controller 130 the RDO signal is derived from an autonomous system clock (CLK), whose input is terminal 132. In the present invention this read data signal 131 is fed into the newly and additionally introduced Read Access Controller (RAC) circuit 150, which then modifies the original read strobe signal 131 into the new resulting read strobe signal (RDR) on terminal 151. This modification of the original read signal 131 results from the new correction method implemented with the new RAC circuit 150 of the present invention, mandatory taking into account the serial clock signal 112 together with the write strobe signal 113.

Figure 1B:
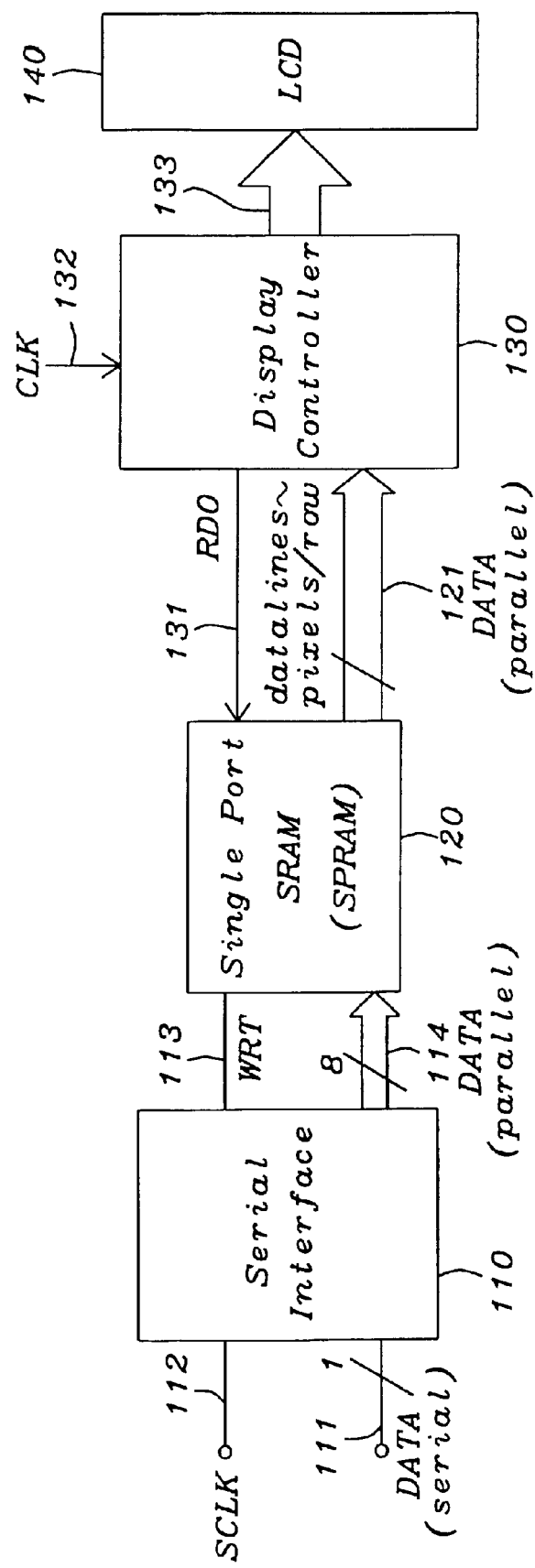
FIG. 1B illustrates in the form of a functional block diagram, a "raw" circuit, picked up herein solely for explanatory purposes. Raw signifies in this context, that this circuit, using single-port RAM without further precautions will not function properly.

Referring now to FIG. 1B, a "raw" circuit is shown for explanatory purposes only, but incorporating the already above mentioned circuit elements: serial interface 110, SPRAM 120, display controller 130 together with LCD 140. Connections to serial interface 110 of SCLK signal 112 and DATA as input 111 and between serial interface 110 and SPRAM 120 of DATA signal 114 and WRT strobe 113 are identical to FIG. 1A. This holds true also for the DATA connection between SPRAM 120 and display controller 130. The missing connection of strobe RDO 131 between display controller 130 and SPRAM 120 is now established directly as shown, i.e. without any intermediate means. The autonomous system clock CLK is applied to display controller 130 via terminal 132. Examining now the behavior of the circuit in more details, one can find, that in certain cases read-write access collisions occur because of the independent write access via WRT strobe 113 and noncorrelated read access via RDO strobe 131 to the same memory location within SPRAM 120. Thus, corrupted data in SPRAM are the inevitable consequence. This problem of access collision is generally not tolerable in this application, thus having led to the new method and circuit of the present invention.

Referring now to the modified flow charts in FIGS. 2A–2D, the preferred embodiment of the new method to avoid said memory access collisions as achieved in the present invention is explained in great detail. The timing diagrams shown in FIGS. 3A–3E may, for convenience, be inspected at the same time in conjunction with the flow charts. The referenced signals and times can be retrieved in both representations. The flow charts are modified in such a way that they include additional groups, the contents of which have to be understood as a logical entity. In fact, the technical realization of this method by the new RAC circuit is not bound to this form of logical description. The signals shown here and in every other flow chart/timing diagram to follow, already characterized in FIG. 1A, are original read strobe RDO 131, serial clock SCLK 112, write strobe WRT 113, resulting read strobe RDR 151 together with signals internal to the RAC circuit 150, namely a read block signal (RDBLK) and a read OK indicator signal (RDOK). Where the assertion of the read block signal has the function of blocking/inhibiting the original read signal (RDO) in certain cases; ist does not mean the reading of a block (array) of data. For a better understanding of the following explanations, flow charts and timing diagrams it may be helpful to obey to the following terms and agreements, here presented hierarchically and self-explanatory:

Signals Regarded:

--- independent signals are:
SCLK  =  serial clock signal
RDO  =  original read strobe signal (generated by display controller)
dependent signals are:
WRT  =  write strobe signal (generated by serial interface)
   dependent and generated (within or by the RAC) signals are:
   RDBLK  =  read block signal (internal signal)
   RDBLK "TRUE" signifies, to block / inhibit a read signal (RDO)

-continued

RDBLK "FALSE" signifies, to allow a read signal (RDO) to execute
RDOK    =    read OK signal (internal signal)
RDOK "TRUE" signifies, a read access has
been performed successfully,
RDOK "FALSE" signifies, no read access has
taken place in the currently observed cycle.
RDR    =    resulting read strobe signal (output signal)
All signals are of positive logic, i.e.:
    logically "TRUE" = high signal level = asserted = active
    logically "FALSE" = low signal level = cleared = inactive
where "TRUE" signifies respectively,
block signal inhibits or strobe reads.

Times Observed:

Tstart ("signal")=point of time, where "signal" changes from low level to high level Tend ("signal")=point of time, where "signal" changes from high level to low level and where "signal" stands for each signal mentioned above.

Figure 2A:
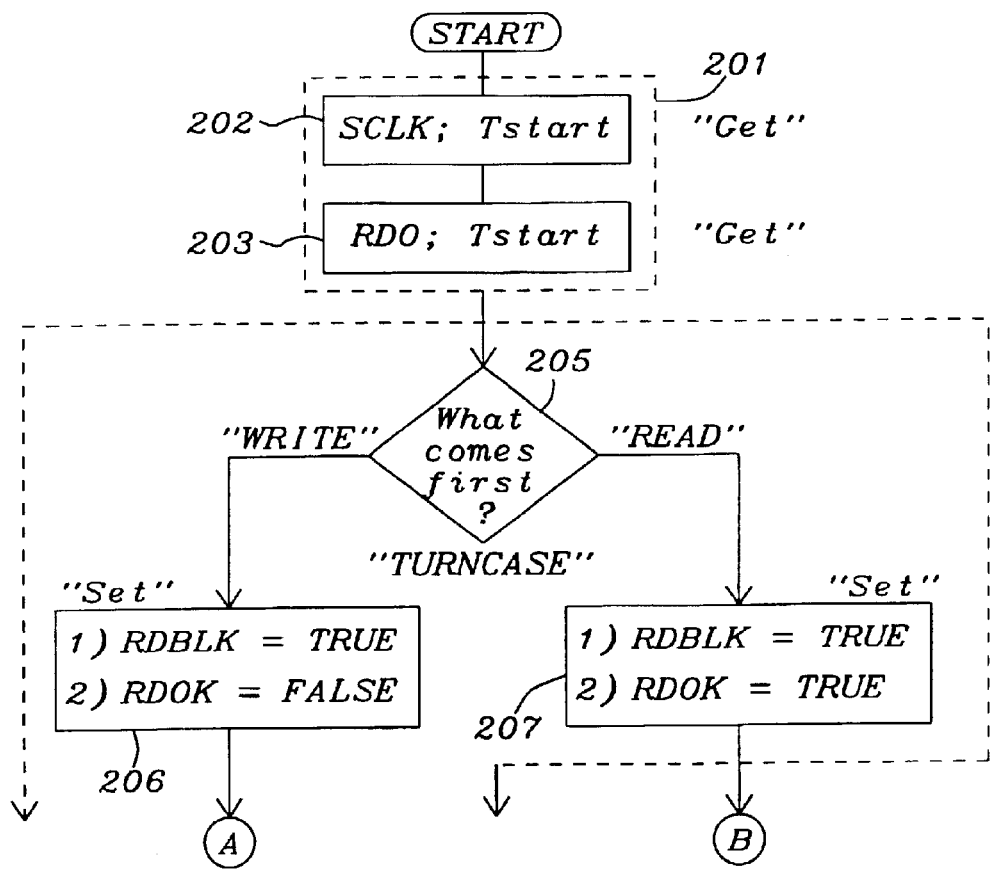
FIGS. 2A, 2B, 2C & 2D depict, in the form of a modified flowchart diagram, the preferred method of the present invention.

As an important help for understanding the following modified flowcharts an extensive summary of legends to FIGS. 2A–2D with elaborate pieces of explanation texts and additional remarks is given below, thus completing the short textual entries in the diagrams. The numbers to the left are always referring to the tag numbers in the diagrams:

| | Legend for FIG. 2A |
|---|---|
| 201 | Prepare for evaluation of serial clock signal (SCLK) and original read strobe signal (RDO) with regard to correlation in time. |
| 202 | Get SCLK input, regard time Tstart (SCLK). |
| 203 | Get RDO input, regard time Tstart (RDO). |
| 204 | Prepare for generation of appropriate read OK signal (RDOK) together with according read block signal (RDBLK), depending on the relation of the above starting times. |
| 205 | Check now: Tstart (SCLK) < Tstart (RDO), <br>   i.e. SCLK earlier than RDO or what comes first? <br>     Case named "TURN CASE", <br>     results are "WRITE" or "READ". <br>     "TURN CASE: WRITE" |
| 206 | 1) Set RDBLK signal TRUE, where Tstart (RDBLK) = Tstart (SCLK). <br> 2) Set RDOK signal FALSE. <br>     "TURN CASE: READ" |
| 207 | 1) Set RDBLK signal TRUE, where Tstart (RDBLK) = Tstart (SCLK) + deltaT, with appropriate time delay deltaT > 0. <br> 2) Set RDOK signal TRUE, where Tstart (RDOK) = Tstart (SCLK). |
| | Legend for FIG. 2B |
| | "TURN CASE: WRITE" continued |
| 208 | Get write strobe signal (WRT), regard time Tend (WRT). |
| 209 | Set RDBLK signal FALSE, where Tend (RDBLK) = Tend (WRT). |
| 210 | Prepare for starting of resulting read strobe signal (RDR), based on status of RDBLK signal. |
| 211 | Check now: status of RDBLK signal, RDBLK=FALSE or RDBLK=TRUE, or which state has RDBLK now ? <br>     Case named "BLOCK CASE", <br>     results are "FALSE" or "TRUE". <br>     "BLOCK CASE: FALSE" |
| 212 | Set RDR signal=TRUE, where Tstart (RDR)=Tstart (RDO). <br>     "BLOCK CASE: TRUE" |
| 213 | Set RDR signal=TRUE, where Tstart (RDR) = Tend (WRT). |
| | Legend for FIG. 2C |
| 214 | Prepare for stopping of RDR signal, based on status of RDO signal. |
| 215 | Get RDO input, regard time Tend (RDO). |
| 216 | Set RDR signal=FALSE, where Tend (RDR) = Tend (RDO). |
| | Legend for FIG. 2D |
| | "TURN CASE: READ" continued |
| 217 | Prepare for generation of resulting read strobe signal (RDR). |
| 218 | Set RDR signal=TRUE, where Tstart (RDR) = Tstart (RDO). |
| 219 | Set RDR signal=FALSE, where Tend (RDR) = Tstart (SCLK) + deltaT, with appropriate time delay deltaT > 0. |
| 220 | Prepare for stopping of RDBLK and RDOK signals, based on status of RDO signal. |
| 221 | Get RDO input, regard time Tend (RDO). |
| 222 | Set RDBLK signal FALSE, where Tend (RDBLK) = Tend (RDO). |
| 223 | Set RDOK signal FALSE, where Tend (RDOK) = Tend (RDO). |

As shown now in FIG. 2A, commencing a cycle of operation at label START enters logical block 201, which prepares for the evaluation of serial clock signal SCLK and original read strobe signal RDO with regard to their correlation in time. Block 202 represents logically, that the RAC circuit analyzes serial clock SCLK getting active and notes the corresponding instant Tstart (SCLK). Block 203 represents logically, that the RAC circuit analyzes the original read strobe RDO getting active and notes the corresponding instant Tstart (RDO). The following block 204 prepares for the generation of an appropriate read OK signal (RDOK) together with the according read block signal (RDBLK), depending on the relation of the above starting times. The necessary logical case decision is made in block 205, named "TURN CASE". Is the serial clock SCLK starting earlier than the original read strobe signal RDO? Answers could be "WRITE" or "READ".

In case of Tstart (SCLK) less than Tstart (RDO)—named "TURN CASE: WRITE" in block 205—, continuation with block 206 sets both, read block signal RDBLK and read OK signal RDOK "FALSE" correlated to the corresponding SCLK signal activity, as can be seen from timing diagrams FIG. 3A and FIG. 3B.

In case of Tstart (SCLK) greater or equal than Tstart (RDO)—named "TURN CASE: READ" in block 205—, continuation with block 207 sets the read OK signal RDOK "TRUE" and, after a certain, appropriate time delay delta T>0, the read block signal RDBLK now "TRUE", correlated to the corresponding SCLK signal activity, as can be seen from timing diagrams FIG. 3C or FIG. 4D. The delay time delta T corresponds to a certain number of serial clock SCLK bits and must be chosen in such a way that under every feasible situation a secure operation is guaranteed. Given the following prerequisite, that the write strobe WRT is short compared to the original read strobe RDO, i.e. the serial clock frequency f(SCLK) is significantly higher than the system clock frequency f(CLK) a minimal duration of the resulting read strobe RDR must be achieved, long enough for a proper read operation.

Figure 2B:
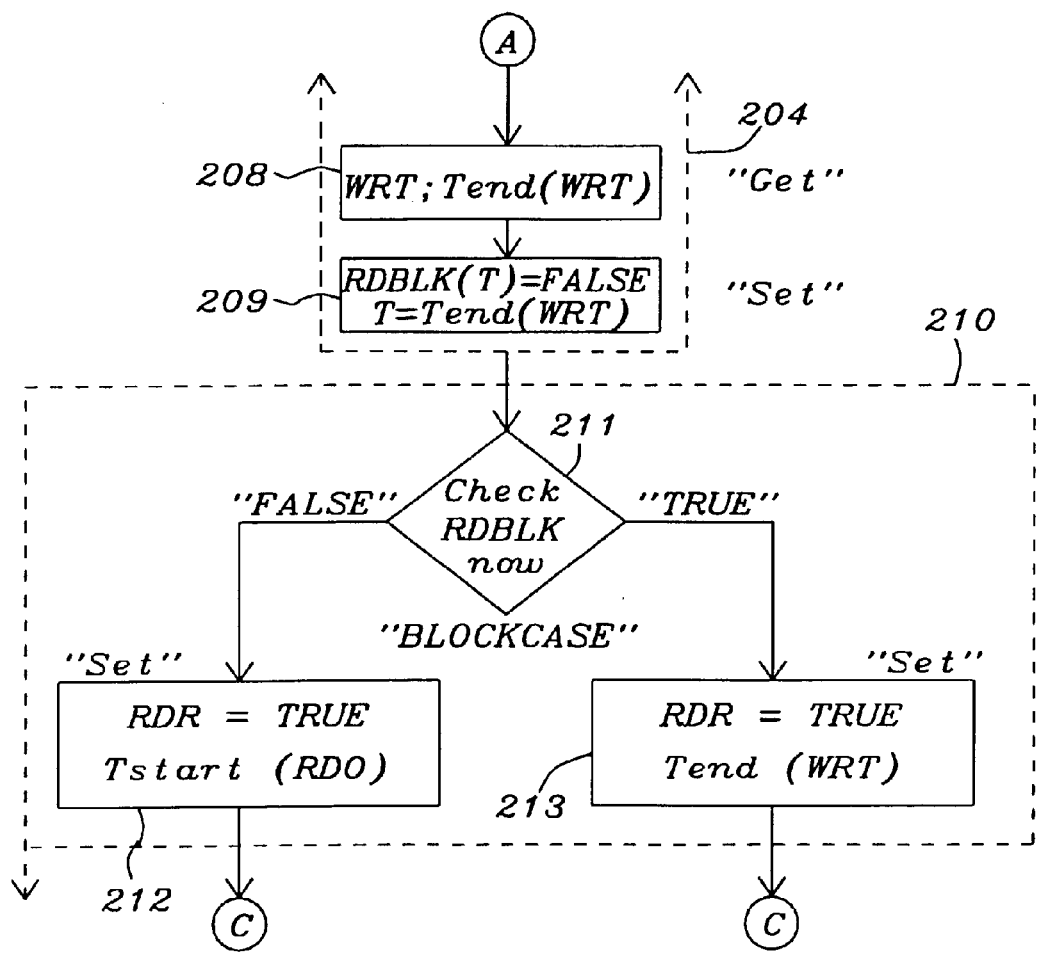

Continuation for "TURN CASE: WRITE", as shown in FIG. 2B terminates the activity of the read block signal RDBLK—setting RDBLK "FALSE"—in the moment after the write strobe impulse WRT has been triggered, logically depicted by blocks 208 and 209. The generation of the new resulting read strobe RDR is prepared in logical block 210; in a last analysis the main objective of the invention. The starting behavior of the resulting read strobe RDR depends on the status of the read block RDBLK, checked in logical decision block 211, named "BLOCK CASE". Status of read block being "FALSE" at the instant of check, namely Tstart (RDO), sets resulting read strobe RDR immediately "TRUE", see logical block 212. This behavior is shown in timing diagram FIG. 3A. Status of read block being "TRUE" at the instant of check, namely T start (RDO), sets resulting read strobe RDR "TRUE" also, but delayed until after the write strobe impulse has been triggered, see logical block 213. This behavior is shown in timing diagram FIG. 3B. Both cases, namely "BLOCK CASE: FALSE" and "BLOCK CASE: TRUE" lead to an action depicted and described together in FIG. 2C.

Figure 2C:
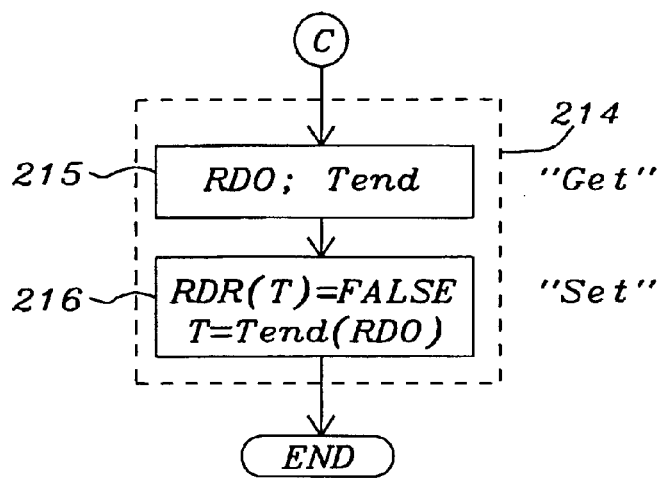

Looking now at FIG. 2C we can see, that the termination of activity of the new resulting read strobe RDR is prepared in logical block 214. The stopping behavior is controlled solely by the original read strobe RDO, as logically explained within blocks 215 and 216. This behavior is shown in timing diagrams FIG. 3A and FIG. 3B. Thus, in these cases a cycle of operation is now terminated at flow chart label END of FIG. 2C and may restart at flow chart label START in FIG. 2A.

Resorting back to the flow chart of FIG. 2A, we noticed for "TURN CASE: READ" that read OK signal RDOK has been set to "TRUE" and read block signal RDBLK has been set to "TRUE", all at instants already explained above and shown again in the timing diagrams of FIG. 3C or FIG. 4D.

Figure 2D:
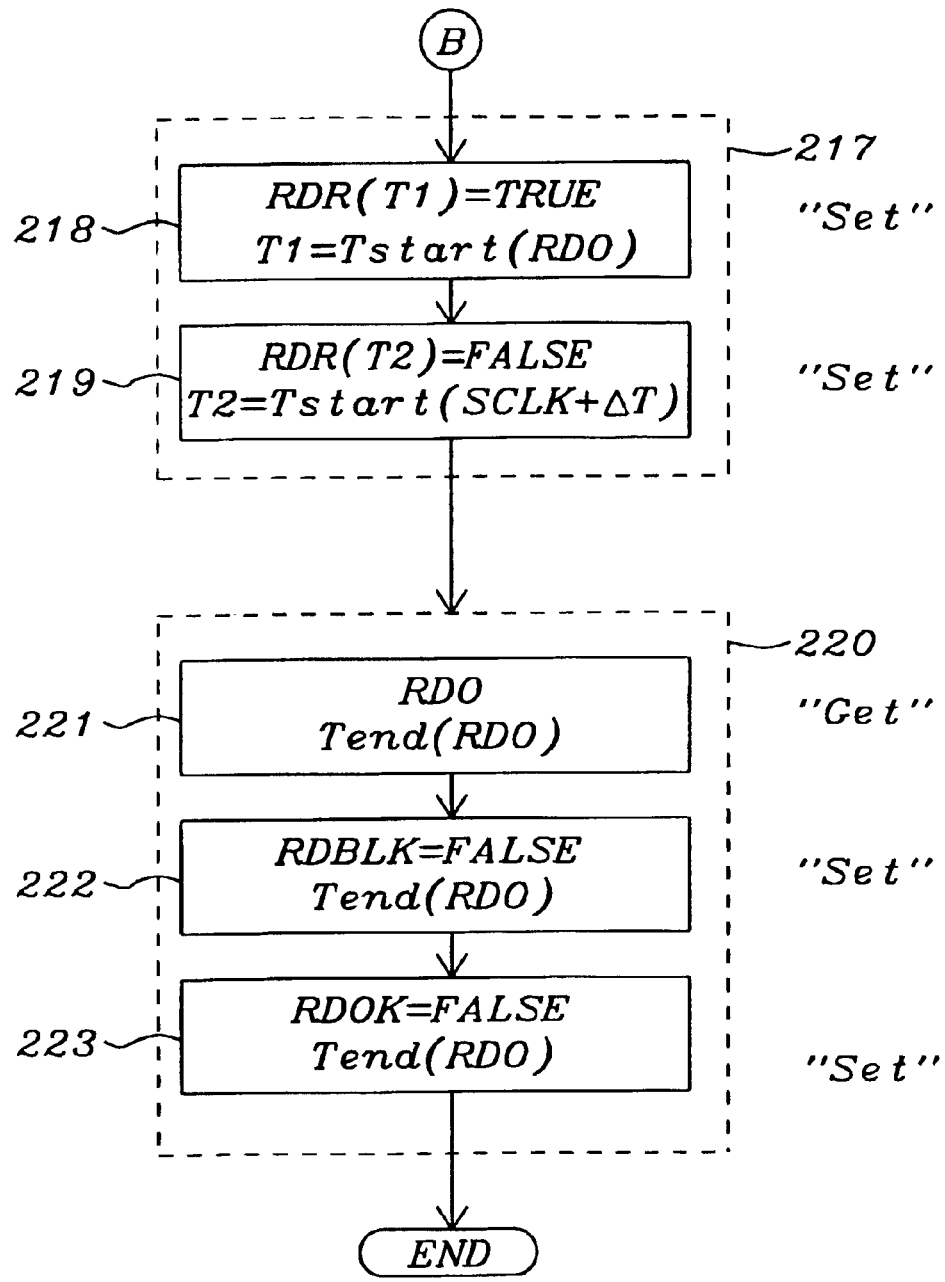

Looking now at FIG. 2D the continuation leads to logical block 217, where the generation of the new resulting read strobe RDR is prepared. In correlation with the start of the original read strobe RDO the new resulting read strobe RDR is firstly set "TRUE", see logical block 218. In correlation with the start of the serial clock SCLK, delayed by a certain, appropriate time delta T>0, the new resulting read strobe RDR is finally set "FALSE", see logical block 219. This behavior is again shown clearly in the timing diagrams of FIGS. 3C and 3D or FIG. 4D.

The only task left for logical block 220, is to prepare for the stopping of both the read block signal RDBLK and the read OK signal RDOK. As this is correlated again to the end of activity of the original read strobe RDO, logical block 221 notes again the end of activity of original read strobe RDO, setting the read block signal RDBLK "FALSE" and the read OK signal RDOK "FALSE" at this same moment, logically described with block 222 and block 223 respectively. Both of these signals are again shown in the timing diagrams of FIG. 3C or FIG. 3D. Thus too, in the "TURN CASE: READ", a cycle of operation is terminated at flow chart label END of FIG. 2D and may also restart at flow chart label START in FIG. 2A. The cases with multiple write accesses are included when the logical behavior is adequately super positioned by restarting the cycles.

Figure 3A:
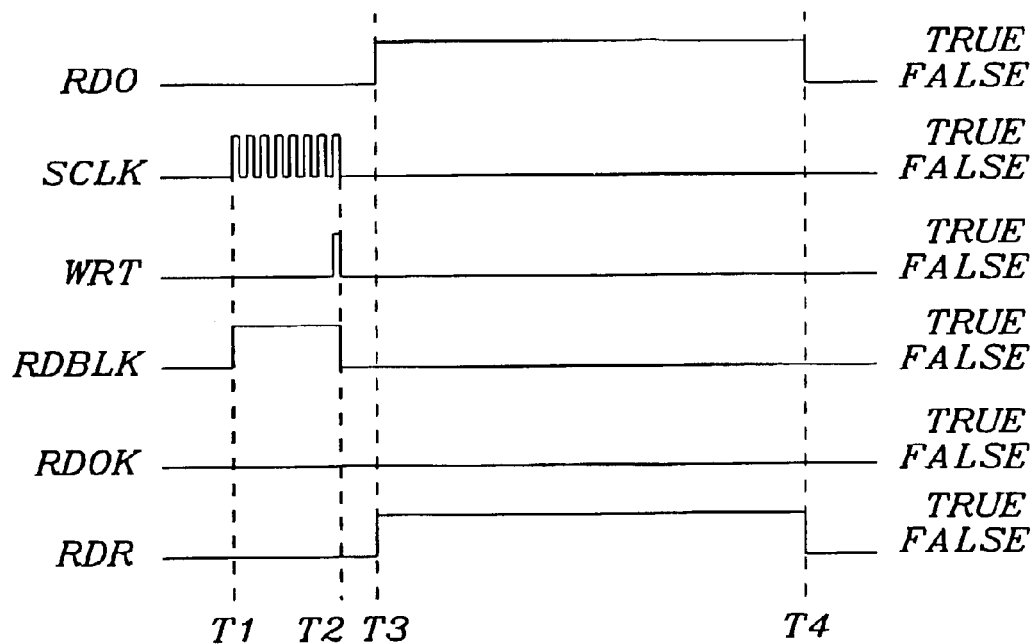
FIG. 3A shows the timing diagram for a first discernible case, named "READING AND WRITING: NO COLLISIONS!" as realized with the present invention.

Legends to Timing Diagrams FIGS. 3A–3E and FIGS. 4A–4D:

| | |
|---|---|
| FIG. 3A: | "READING AND WRITING: NO COLLISIONS!" |
| T1: | Tstart (SCLK) = Tstart (RDBLK) |
| T2: | Tend (WRT) = Tend (RDBLK) |
| T3: | Tstart (RDO) = Tstart (RDR) |
| T4: | Tend (RDO) = Tend (RDR) |
| FIG. 3B: | "WRITING OVERLAPS READ ACCESS!" |
| T1: | Tstart (SCLK) = Tstart (RDBLK) |
| T2: | Tend (WRT) = Tend (RDBLK) = Tstart (RDR) |
| T3: | Tend (RDO) = Tend (RDR) |
| FIG. 3C: | "WRITING WHILE READ ACCESS IN PROGRESS!" |
| T1: | Tstart (RDO) = Tstart (RDR) |
| T2: | Tstart (SCLK) = Tstart (RDOK) |
| T3: | Tstart (SCLK) + deltaT = Tstart (RDBLK) |
| T4: | Tend (RDO) = Tend (RDBLK) = Tend (RDOK) |
| FIG. 3D: | "WRITING AT END OF READ ACCESS (SHORTENED)!" |
| T1: | Tstart (RDO) = Tstart (RDR) |
| T2: | Tstart (SCLK) = Tstart (RDOK) |
| T3: | Tstart (SCLK) + deltaT = Tstart (RDBLK) = Tend (RDR) |
| T4: | Tend (RDO) = Tend (RDBLK) = Tend (RDOK) |
| FIG. 3E: | "WRITING AT END OF READ ACCESS (FULL)!" |
| T1: | Tstart (RDO) = Tstart (RDR) |
| T2: | Tstart (SCLK) = Tstart (RDOK) |
| T3: | Tend (RDO) = Tend (RDOK) = Tend (RDR) |
| FIG. 4A: | "MULTIPLE WRITE ACCESSES!" |
| T1: | Tstart (SCLK) = Tstart (RDBLK) |
| T2: | Tend (WRT) = Tend (RDBLK) |
| T3: | Tstart (SCLK) = Tstart (RDBLK) |
| T4: | Tend (WRT) = Tend (RDR) |
| T5: | Tend (RDO) = Tend (RDR) |
| FIG. 4B: | "MULTIPLE WRITE ACCESSES!" |
| T1: | Tstart (SCLK) = Tstart (RDBLK) |
| T2: | Tend (WRT) = Tend (RDBLK) |
| T3: | Tstart (RDO) = Tstart (RDR) |
| T4: | Tstart (SCLK) = Tstart (RDOK) |
| T5: | Tstart (SCLK) + deltaT = Tstart (RDBLK) = Tend (RDR) |
| T6: | Tend (RDO) = Tend (RDBLK) = Tend (RDOK) |

-continued

Figure 4A:
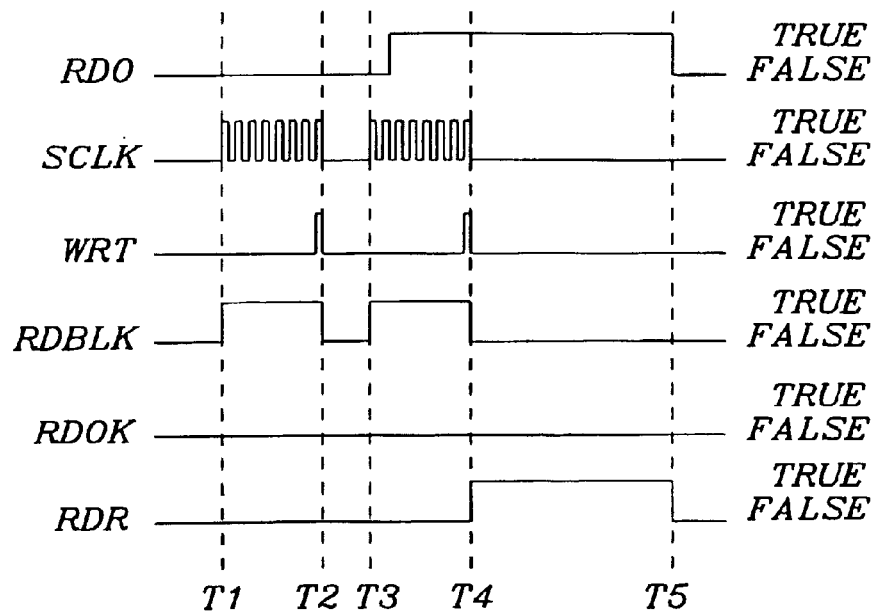
FIGS. 4A, 4B, 4C and 4D show the timing diagrams for combinations of the cases in FIGS. 3A to 3E, summarized as cases "MULTIPLE WRITE ACCESSES!" as realized with the present invention.
Figure 4B:
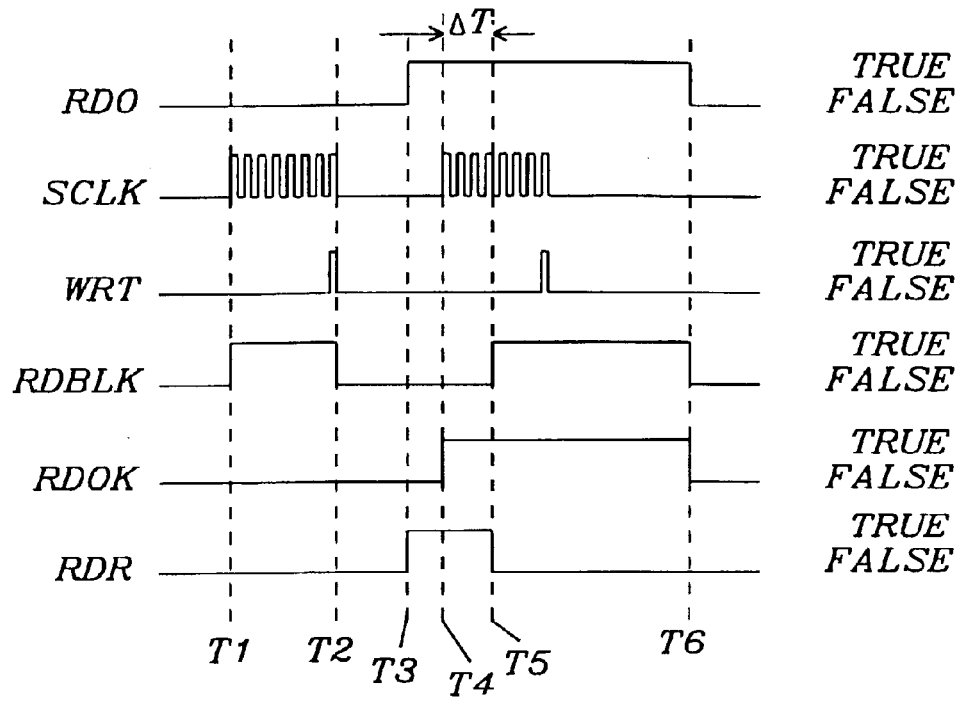
Figure 4C:
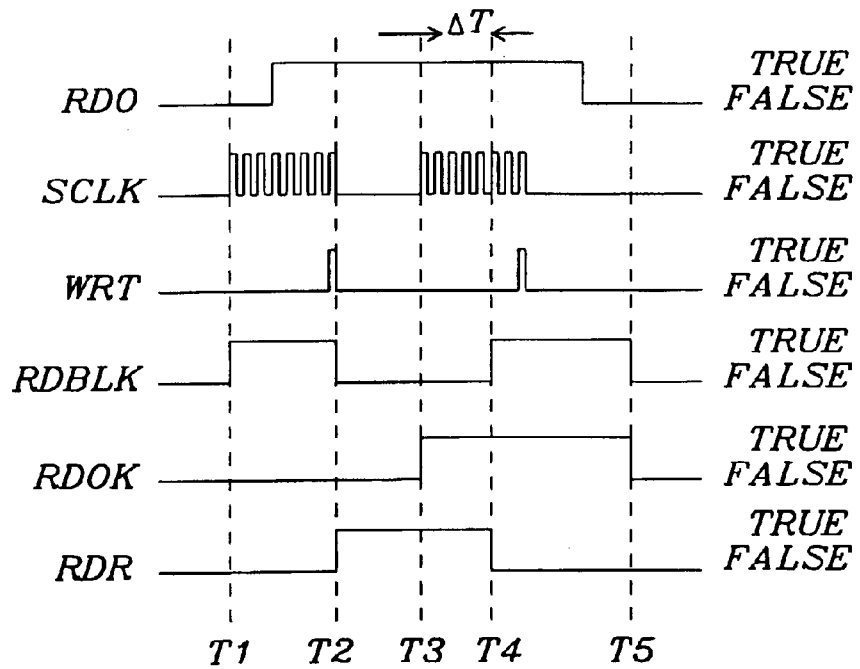
Figure 4D:
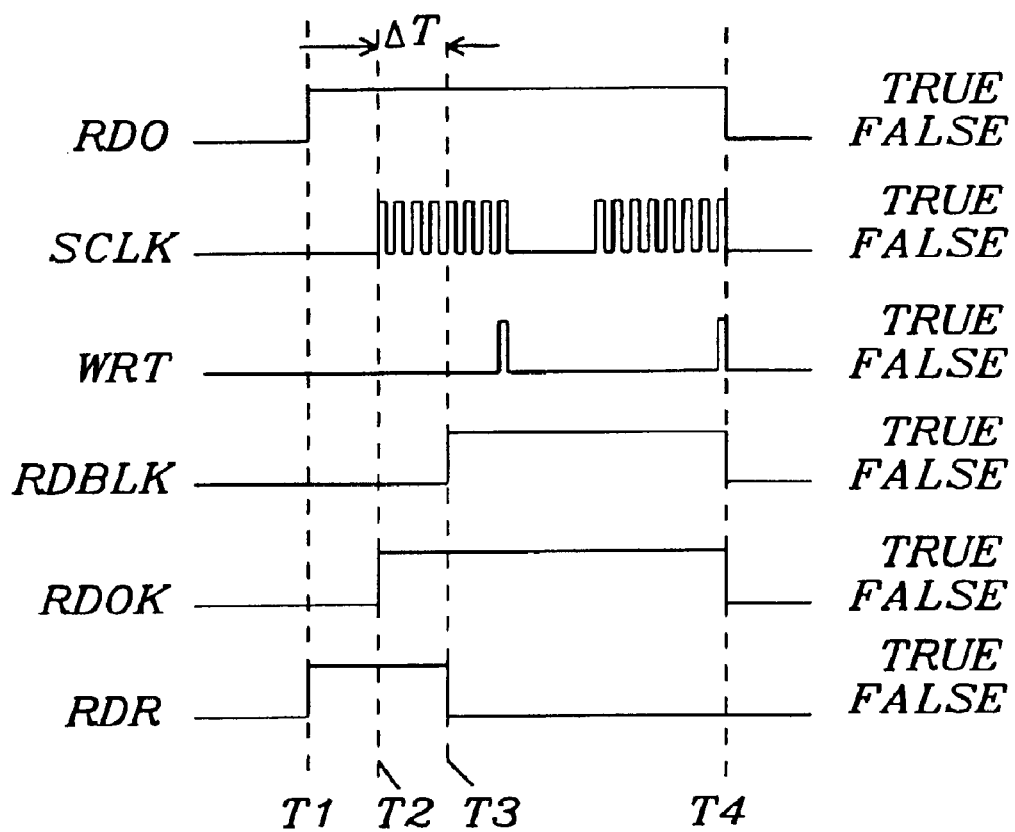

| | |
|---|---|
| FIG. 4C: | "MULTIPLE WRITE ACCESSES!" |
| T1: | Tstart (SCLK) = Tstart (RDBLK) |
| T2: | Tend (WRT) = Tend (RDBLK) = Tstart (RDR) |
| T3: | Tstart (SCLK) = Tstart (RDOK) |
| T4: | Tstart (SCLK) + deltaT = Tstart (RDBLK) = Tend (RDR) |
| T5: | Tend (RDO) = Tend (RDBLK) = Tend (RDOK) |
| FIG. 4D: | "MULTIPLE WRITE ACCESSES!" |
| T1: | Tstart (RDO) = Tstart (RDR) |
| T2: | Tstart (SCLK) = Tstart (RDOK) |
| T3: | Tstart (SCLK) + deltaT = Tstart (RDBLK) = Tend (RDR) |
| T4: | Tend (RDO) = Tend (RDBLK) = Tend (RDOK) |

Referring now to the timing diagram in FIG. 3A, the mode of operation of the preferred embodiment of the new method and circuit of the present invention is further explained for a first case in time relation of serial clock input and original read strobe signal. This case can be named "READING AND WRITING: NO COLLISIONS!". The signals shown here and in every other timing diagram to follow, already characterized in FIG. 1A, are original read strobe RDO 131, serial clock SCLK 112, write strobe WRT 113, resulting read strobe RDR 151 together with signals internal to the RAC circuit 150 of FIG. 1A, namely a read block signal (RDBLK) and a read OK indicator signal (RDOK).

The input with serial clock signal SCLK and the original read strobe signal RDO are not overlapping in time, i.e. no write strobe impulse WRT initiating a write access occurs during the read cycle, i.e. when the original read strobe RDO is active and a read access is running. The resulting read strobe signal RDR is identical to the original read strobe signal RDO. The read OK signal RDOK is always "FALSE". By the way, the read block signal RDBLK is optional in this case, i.e. has no influence. No memory access collision can occur. The choice, to set the RDBLK signal nevertheless "TRUE", as indicated in FIG. 3A is explained within the description to follow of FIG. 3B.

Figure 3B:
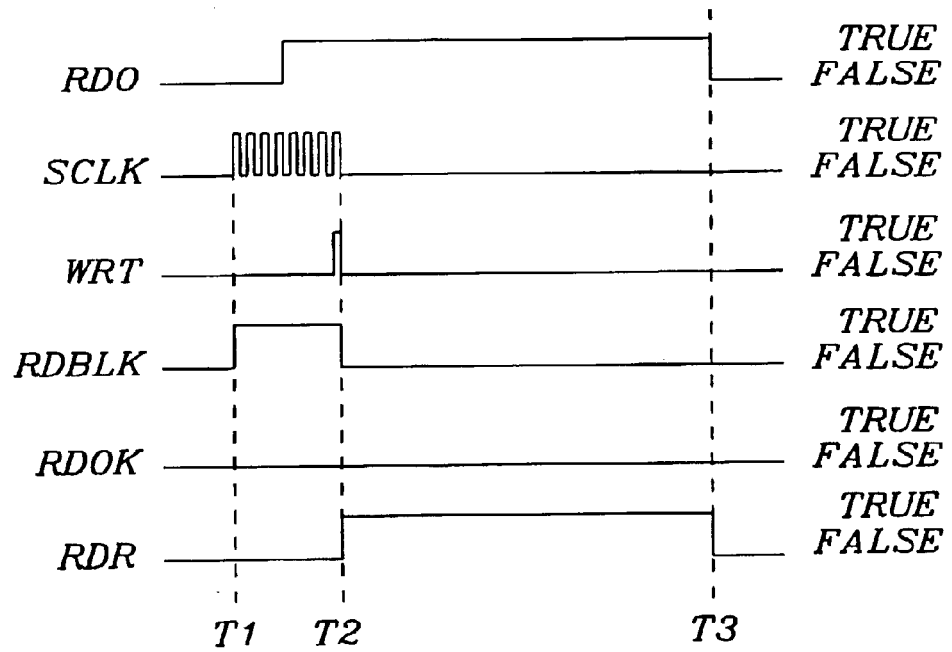
FIG. 3B shows the timing diagram for a second discernible case, named "WRITING OVERLAPS READ ACCESS!" as realized with the present invention.

Referring now to the timing diagram in FIG. 3B, the mode of operation of the preferred embodiment of the new method and circuit of the present invention is explained for a second case in time relation of serial clock input and original read strobe. This case can be named "WRITING OVERLAPS READ ACCESS!". The serial clock signal SCLK starts a write transmission shortly before the original read strobe occurs i.e. a write strobe impulse WRT, generated at the last bit of the serial clock signal SCLK triggers write access during the active original read strobe signal RDO. As a problem: now an access collision would happen! To solve this problem an appropriate read block signal RDBLK is generated that inhibits the original read strobe signal RDO. After the write access has completed, the read block signal RDBLK is cleared and the resulting read strobe signal RDR—somewhat shorter, but still of sufficient length for a proper read operation—is applied to SPRAM. Thus, the collision problem in this case is solved by the present invention.

As now it can be understood from the explanations above the two signals RDBLK and RDOK, internal signals of the newly introduced Read Access Controller (RAC) circuit are the essential controlling signals within the memory access collision avoidance scheme.

They are reset, set and hold from one system clock (CLK) cycle to the other, conditionally depending of the states of the signals SCLK and RDO during these cycles. The read OK signal (RDOK) hereby being immediately set "TRUE" if during an ongoing read process (RDO already "TRUE") a concurrent write process (SCLK) is being started, thus indicating to the controller, that a read process (RDO) is already in progress.

The necessary read block signal (RDBLK) is then generated, if after a certain necessary time delay delta T (necessary for the avoidance of glitches, that is, to ensure minimum duration of read strobe) these conditions still hold true. By consequence, the resulting read strobe signal (RDR) is modified by logically AND combining the original read strobe signal (RDO) with this inverted read block signal (_RDBLK).

The necessitated time delay delta T is determined by counting a certain number of serial clock (SCLK) cycles, thus being tied to the incoming clock frequency.

Figure 3C:
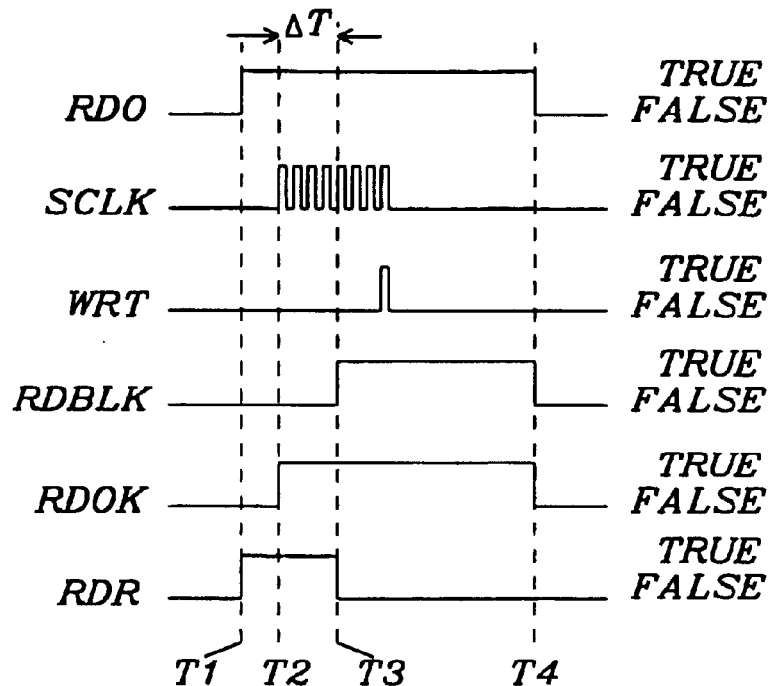
FIG. 3C shows the timing diagram for a third discernible case, named "WRITING WHILE READ ACCESS IN PROGRESS!" as realized with the present invention.

Referring now to the timing diagram in FIG. 3C, the mode of operation of the preferred embodiment of the new method and circuit of the present invention is explained for a third case in time relation of serial clock input and original read strobe. This case can be named "WRITING WHILE READ ACCESS IN PROGRESS!". A write transmission occurs after the original read strobe signal RDO has already become active i.e. the serial clock signal SCLK starts after the read access has begun. At the same time the read OK signal RDOK is asserted "TRUE". As a problem: the write strobe impulse WRT triggers write access again during the active original read strobe RDO. This now would lead again to a memory access collision since the resulting read strobe RDR has already been started together with the original read strobe RDO; because it is unknown at the beginning of the read cycle, that later on a write access will occur! To solve this problem an appropriate read block signal RDBLK is generated. After a certain number of serial clock impulses SCLK introducing a time delay delta T as shown in FIG. 3C, this read block signal RDBLK is asserted "TRUE" and since the read OK signal RDOK is "TRUE" immediately terminates the active resulting read strobe signal RDR. This time delay delta T ensures a minimal duration of the read strobe signal RDR, long enough for a proper read operation i.e avoiding glitches. If the read strobe signal RDR would be started together with the original read strobe signal RDO and stopped with the write strobe impulse WRT it might become too short for a successful read operation. This time delay delta T can simply be realized by counting a certain number of serial clock SCLK impulses, as already explained above. Since that read block signal RDBLK would be terminated by the write strobe impulse WRT—as can be seen from the case depicted in FIG. 3B—the additional read OK signal RDOK "TRUE" is also necessitated, which keeps the read block signal RDBLK from being cleared. This read OK signal RDOK is always set "TRUE" when a serial write transmission starts, i.e. the serial clock signal SCLK is starting whilst there is already an ongoing active read access. Because of the termination of the resulting read strobe signal RDR before the write strobe impulse WRT triggers the write access, an undisturbed write access is guaranteed. Both signals, read block RDBLK and read OK RDOK are cleared at the end of the read cycle, i.e. when the original read strobe signal is inactivated. Thus too, the problem in this case is solved by the present invention.

Figure 3D:
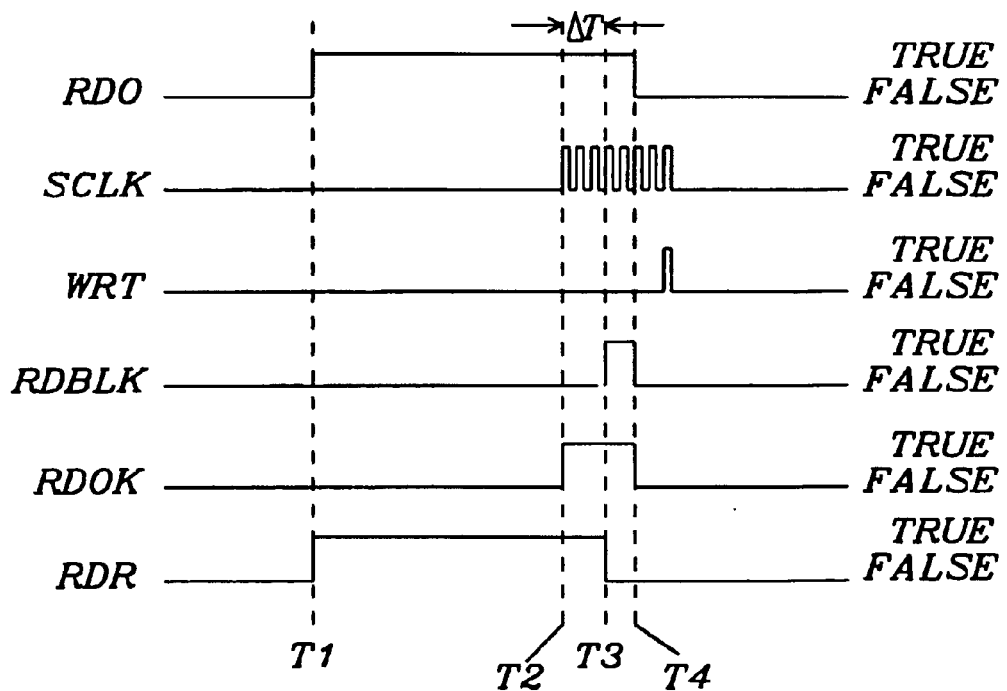
FIGS. 3D and 3E show timing diagrams for two more cases, namely "WRITING AT END OF READ ACCESS! (SHORTENED)" and "WRITING AT END OF READ ACCESS! (FULL)" as realized with the present invention.
Figure 3E:
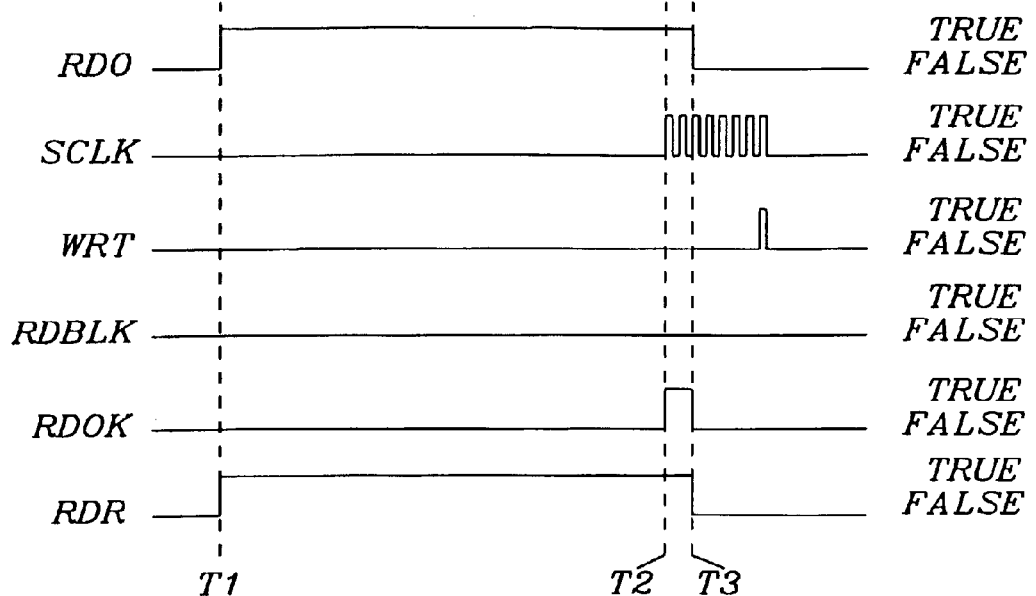

Referring now to the timing diagrams in FIGS. 3D and 3E the situation for the two cases "WRITING AT END OF READ ACCESS (SHORTENED)!" and "WRITING AT END OF READ ACCESS (FULL)!" will be described. This situation is essentially exactly the same as for the case "WRITING WHILE READ ACCESS IN PROGRESS!" depicted in FIG. 3C and described above, except that if the time delay delta T (determined by counting a certain number of SCLK pulses) is not reached—that is not enough clock pulses SCLK have arrived until the end of the original read strobe signal RDO—no read block signal RDBLK is generated, thus leaving the resulting read strobe signal RDR unchanged i.e. unshortened.

Referring now to the timing diagrams in FIGS. 4A to 4D, the mode of operation of the preferred embodiment of the new method and circuit of the present invention is explained for special sub-cases, all with multiple writes to the SPRAM. These cases will be summarized under the concept "MULTIPLE WRITE ACCESSES!" for simplicity and will be explained mainly as superpositions of the aforementioned cases.

The situation depicted in FIG. 4A is identical to the situation shown in FIG. 3A, case "READING AND WRITING: NO COLLISIONS!" except that a second write transmission on the serial input line arrives during the beginning of the following read cycle i.e. when the original read strobe signal RDO is just getting active. As can be clearly understood from the drawings, this second write access is handled according to the case "WRITING OVERLAPS READ ACCESS!" explained in FIG. 3B, in order not to disturb the correct operation. Since the read block signal RDBLK in this case stays asserted "TRUE" during the activity of the serial clock signal SCLK, the resulting read strobe signal RDR is stalled until activated at that moment, when the writing to the SPRAM has already terminated i.e. no read-write collision can occur.

The situation depicted in FIG. 4B is also identical to the situation shown in FIG. 3A, case "READING AND WRITING: NO COLLISIONS!" except that now a second write transmission on the serial input line arrives after the beginning and during the following read cycle i.e. when the original read strobe RDO is active. As can easily be seen from the drawings, this second write access is handled according to the case "WRITING WHILE READ ACCESS IN PROGRESS!" explained in FIG. 3C, in order not to disturb the correct operation. Since the read block signal RDBLK and the read OK signal RDOK are "FALSE", i.e. both are unasserted at the beginning of the read cycle with the original read strobe signal RDO set active, the resulting read strobe RDR is activated at the same time. This second write access by the serial clock signal SCLK leads immediately to assertion "TRUE" of the read OK signal RDOK. After said time delay described above, corresponding to a certain number of serial clock impulses the read block signal RDBLK is asserted "TRUE". This in turn inactivates the resulting read strobe signal RDR, signifying the termination of the read access to SPRAM before the write strobe impulse WRT triggers the write access. Since the read block signal RDBLK and the read OK signal RDOK stay asserted until the end of the current read cycle further write accesses may execute now without any danger of pending memory access collisions.

The situation depicted in FIG. 4C is identical to the situation shown in FIG. 3B, case "WRITING OVERLAPS READ ACCESS!" except that a second write transmission on the serial input line arrives during the same read cycle i.e. when the original read strobe signal RDO is still active. As can be simply deduced from the drawings, this second write access is handled according to the case "READING: WRITE ACCESS!" explained in FIG. 3C, in order not to disturb the correct operation. Since the read block signal RDBLK is held asserted from the beginning of the activated original read strobe signal RDO, the resulting read strobe signal RDR is stalled until the first write access by serial clock signal SCLK has terminated with its write strobe WRT triggered. In consequence, the read block signal RDBLK is cleared and the resulting read strobe signal RDR is activated. A second write access by the serial clock signal SCLK leads immediately to assertion "TRUE" of the read OK signal RDOK and after said time delay introduced and explained above, corresponding to a certain number of serial clock impulses the read block signal RDBLK is again asserted "TRUE". This in turn inactivates the resulting read strobe signal RDR, signifying the termination of the read access to SPRAM before the second write strobe impulse WRT triggers the second write access. Since the read block signal RDBLK and the read OK signal RDOK stay asserted until the end of the current read cycle further write accesses may execute now without any danger of memory access collisions.

The situation depicted in FIG. 4D is identical to the situation shown in FIG. 3C, case "WRITING WHILE READ ACCESS IN PROGRESS!" except that a second write transmission on the serial input line arrives during the same read cycle i.e. when the original read strobe signal RDO is still activated. As can be clearly understood from the drawings, this second write access is handled according to the case "WRITING WHILE READ ACCESS IN PROGRESS!" explained in FIG. 3C, in order not to disturb the correct operation. Since the read block signal RDBLK is "FALSE" and the read OK signal RDOK is "FALSE", i.e. both are unasserted at the beginning of the read cycle with the original read strobe signal RDO set active, the resulting read strobe signal RDR is activated at the beginning of this read cycle. The first write access by the serial clock signal SCLK leads immediately to assertion "TRUE" of the read OK signal RDOK. After said time delay described above, corresponding to a certain number of serial clock impulses the read block signal RDBLK is asserted "TRUE". This in turn inactivates the resulting read strobe signal RDR, signifying the termination of the read access to SPRAM before the following write strobe impulse WRT triggers the write access. Since the read block signal RDBLK and the RDOK signal are not cleared until the end of the original read cycle, there is only one single resulting read strobe signal RDR sent to the SPRAM during this read cycle i.e. no further read accesses are allowed.

Summarizing the detailed explanations above proves, regarding the operation of the preferred embodiment of the new method and circuit of the present invention as described in FIGS. 4A–4D, that there is only one single resulting read strobe signal RDR sent to the SPRAM during every possible combination of read-write accesses during one read cycle i.e. no second read access is allowed and this resulting read strobe signal RDR is never overlapping with a write strobe impulse WRT. In other words, only one regular read access is performed, exactly what the original read strobe signal RDO called for; even multiple consecutive write accesses are executed without any risk of memory access collisions.

Furthermore some amount of energy saving is achieved by guaranteeing only one regular resulting read strobe signal RDR, even with multiple write accesses. This single resulting read strobe signal RDR during every regular read cycle can be used therefore also for control of an LCD back-plane counter.

As an important feature of the invention can be put out the introduction of a new Read Access Controller circuit 150 (RAC), with only three input signals and one output signal; input signal serial clock 112 (SCLK), input signal write strobe 113 (WRT) and input signal original read strobe 131 (RDO), outputting an access collision avoiding modified read strobe signal 151 (RDR). Internally realizing an elaborate read strobe signal modification scheme as being explained in great detail above, with the help of two, only internally used signals read block (RDBLK) and read OK (RDOK). This original read strobe signal RDO modification algorithm guarantees that there is only one single resulting read strobe signal RDR sent to the SPRAM during every possible case of read-write accesses during one read cycle i.e. no second read access is allowed and this resulting read strobe signal RDR is never overlapping with a write strobe impulse WRT.

As prerequisites for a successful introduction of the RAC circuit must be observed:
1. Use of a serial interface providing a serial clock signal (SCLK).
2. Write access to SPRAM occurs at the end of serial data transmission, i.e. the write strobe impulse (WRT) is generated together with the last incoming data bit, clocked in with the serial clock signal (SCLK) or shortly after the last SCLK impulse has been received.
3. The write strobe impulse (WRT) is short compared to the original read strobe (RDO); (e.g. ⅕ MHz compared to ¹⁄₁₀₀ kHz).

The control established by this RAC-circuit then leads under all circumstances to a collision free read-write access operation with a single-port RAM (SPRAM).

The advantages of the present invention may now be summarized. The present invention provides an effective and very manufacturable method and circuit for control of read-write access to a single-port RAM (SPRAM) with the help of a serial clock signal. Said serial clock signal is delivered by a serial interface for data input, thus writing asynchronous data to said SPRAM and whilst reading from SPRAM occurs periodically, completely independent from the serial clock signal.

The read access control (RAC) method and circuit exhibits access collision free reading from said SPRAM.

Due to the control method implemented in the RAC-circuit, there is exactly one read strobe during each read cycle, even when multiple write accesses occur. Thus the read strobe may be used to increment the backplane counter of an LCD driver circuit. This is a key feature of the invention since it should work with an existing back plane counter which increments with each incoming read strobe signal. In order to ensure the integrity of this counter interface, the invention has to interface with backplane counters in the same way as existing control circuitry is interfacing with existing counters. Generating more than one resulting read strobe signal for an original one would corrupt the operation of the backplane counter. Therefore the invention has to guarantee that there is exactly one resulting read strobe signal generated for each original read strobe signal. Power or better, energy saving is also accomplished because of said single read strobe feature during multiple write accesses.

As shown in the preferred embodiments, the novel circuit provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method for avoiding memory access collisions during read and write operations to a single-port RAM, using collision free serial write access and asynchronous read access comprising:

providing a serial interface, a read device and a control circuit;

utilizing a serial clock signal from said serial interface for said serial write access;

utilizing an original read strobe signal from said read device for said asynchronous read access to said single-port RAM; and generating a single modified resulting read strobe signal for said asynchronous read access to said single-port RAM such that simultaneous access of said read and write operations to said single-port RAM is avoided, whenever said serial write access and said asynchronous read access to said single-port RAM occur.

2. The method according to claim 1 wherein said step of generating said modified resulting read strobe signal comprises:

generating a write strobe signal at the end of said serial clock signal; and generating additional control signals in order to indicate ongoing read processes and in order to block read processes during ongoing write processes; and modifying the original read strobe signal with the help of said additional control signals in order to avoid memory access collisions in such a way, that incoming serial memory write accesses are always executed whereas memory read accesses during such memory write accesses are suppressed.

3. The method according to claim 1 wherein said step of generating said modified resulting read strobe signal comprises:

generating only one single resulting read strobe signal for every original read strobe signal applied even when multiple write accesses occur, thus reducing power consumption of the circuit during operation.

4. The method according to claim 1 wherein said step of generating said modified resulting read strobe signal further comprises:

utilizing said single modified resulting read strobe signal as input signal to a backplane counter of an LCD driver circuit.

5. The method according to claim 1 wherein said step of generating said single modified resulting read strobe signal comprises:

evaluating said serial clock signal, which starts and stops before said original read strobe signal is asserted and which is designated as the first serial clock pulse.

6. The method according to claim 5 wherein said step of generating said modified resulting read strobe signal further comprises:

activating and deactivating said modified resulting read strobe signal timed in coincidence with said original read strobe signal.

7. The method according to claim 6 wherein said step of generating said modified resulting read strobe signal further comprises:

generating two auxiliary signals named read block and read OK;

asserting said read block signal during activity of said first serial clock pulse together with keeping said read OK signal always cleared.

8. The method according to claim 5 wherein said step of generating said modified resulting read strobe signal further comprises:

evaluating multiple serial clock pulses, following said first serial clock pulse, where a second serial clock pulse starts before said original read strobe signal is asserted and stops after said original read strobe signal is asserted and before said original read strobe signal is cleared again; and activating said modified resulting read strobe signal after said second serial clock pulse is terminated and deactivating said modified resulting read strobe signal after said original read strobe signal is cleared.

9. The method according to claim 8 wherein said step of generating said modified resulting read strobe signal further comprises:

generating two auxiliary signals named read block and read OK;

asserting said read block signal during activity of said first serial clock pulse together with keeping said read OK signal always cleared.

10. The method according to claim 8 wherein said step of generating said modified resulting read strobe signal further comprises:

generating two auxiliary signals named read block and read OK;

asserting said read block signal while said first serial clock pulse is activated and also while said second serial clock pulse is activated together with keeping said read OK signal always cleared.

11. The method according to claim 5 wherein said step of generating said single modified resulting read strobe signal further comprises:

evaluating multiple serial clock pulse, following said first serial clock pulse, where a second serial clock pulse starts and stops after said original read strobe signal is asserted and before said original read strobe signal is cleared again;

activating said single modified resulting read strobe signal when said original read strobe signal is asserted; and deactivating said single modified resulting read strobe signal after a certain period of time, corresponding to a certain minimal number of clock pulses of said second serial clock pulse, after said second serial clock pulse is activated, where said certain period of time or said minimal number of serial clock pulses have to be chosen in such a way that a complete undisturbed read operation from said single-port RAM is guaranteed.

12. The method according to claim 11 wherein said step of generating said modified resulting read strobe signal further comprises:

generating two auxiliary signals named read block and read OK;

asserting said read block signal after said certain period of time after said first serial clock pulse is activated together with asserting said read OK signal when said serial clock pulse is activated; and clearing said read block signal and said read OK signal when said original read strobe signal is inactivated.

13. The method according to claim 11 wherein said step of generating said modified resulting read strobe signal further comprises:

generating two auxiliary signals named read block and read OK;

asserting said read block signal while said first serial clock pulse is activated and also after said certain period of time after said second serial clock pulse is activated together with asserting said read OK signal when said second serial clock pulse is activated; and clearing said read block signal and said read OK signal when said original read strobe signal is inactivated.

14. The method according to claim 1 wherein said step of generating said modified resulting read strobe signal comprises:

evaluating said serial clock signal, which starts before and stops after said original read strobe signal is asserted and before said original read strobe signal is cleared again and which is designated as the first serial clock pulse.

15. The method according to claim 14 wherein said step of generating said modified resulting read strobe signal further comprises:

activating said modified resulting read strobe signal after said first serial clock pulse is terminated; and deactivating said modified resulting read strobe signal after said original read strobe signal is cleared.

16. The method according to claim 15 wherein said step of generating said modified resulting read strobe signal further comprises:

generating two auxiliary signals named read block and read OK;

asserting said read block signal during activity of said first serial clock pulse together with keeping said read OK signal always cleared.

17. The method according to claim 14 wherein said step of generating said modified resulting read strobe signal further comprises:

evaluating multiple serial clock pulses, following said first serial clock pulse, where a second serial clock pulse starts and stops after said original read strobe signal is asserted and before said original read strobe signal is cleared again;

activating said modified resulting read strobe signal when said first clock pulse is deactivated; and deactivating said modified resulting read strobe signal after a certain period of time, corresponding to a certain minimal number of clock pulses of said second serial clock pulse, after said second serial clock pulse is activated, where said certain period of time or said minimal number of serial clock pulses have to be chosen in such a way that a complete undisturbed read operation from said single-port RAM is guaranteed.

18. The method according to claim 17 wherein said step of generating said modified resulting read strobe signal further comprises:

generating two auxiliary signals named read block and read OK;

asserting said read block signal during the activity of said first serial clock pulse; and clearing said read block signal after the activity of said first serial clock pulse has terminated;

reasserting said read block signal again after said certain period of time after said second clock pulse is activated together with asserting said read OK signal when said second serial clock pulse is activated; and clearing said read block signal and said read OK signal when said original read strobe signal is inactivated.

19. The method according to claim 1 wherein said step of generating said modified resulting read strobe signal comprises:

evaluating said serial clock signal, which starts and stops after said original read strobe signal is asserted and before said original read strobe signal is cleared again and which is designated as the first serial clock pulse.

20. The method according to claim 19 wherein said step of generating said modified resulting read strobe signal further comprises:

activating said modified resulting read strobe signal when said original read strobe signal is asserted; and deactivating said modified resulting rad strobe signal after a certain period of time, corresponding to a certain minimal number of clock pulses of said first serial clock pulse, after said first serial clock pulse is activated, where said certain period of time or said minimal number of serial clock pulses have to be chosen in such a way that a complete undisturbed read operation from said single-port RAM is guaranteed.

21. The method according to claim 20 wherein said step of generating said modified resulting read strobe signal further comprises:

generating two auxiliary signals named read block and read OK;

asserting said read block signal after said certain period of time after said first serial clock pulse is activated together with asserting said read OK signal when said serial clock pulse is activated; and clearing said read block signal and said read OK signal when said original read strobe signal is inactivated.

22. The method according to claim 19 wherein said step of generating said modified resulting read strobe signal further comprises:

activating said modified resulting read strobe signal when said original read strobe signal is asserted; and deactivating said modified resulting rad strobe signal when said original read strobe signal is inactivated.

23. The method according to claim 22 wherein said step of generating said modified resulting read strobe signal further comprises:

generating one auxiliary signal named read OK;

asserting said read OK signal when said first serial clock pulse is activated; and clearing said read OK signal when said original read strobe signal is inactivated.

24. The method according to claim 19 wherein said step of generating said modified resulting read strobe signal further comprises:

evaluating multiple serial clock pulse, following said first serial clock pulse, where a second serial clock pulse starts and stops after said original read strobe signal is asserted and before said original read strobe signal is cleared again;

activating said modified resulting read strobe signal when said original read strobe signal is asserted; and deactivating said modified resulting read strobe signal after a certain period of time, corresponding to a certain minimal number of clock pulses of said second serial clock pulsed, after said second serial clock pulse is activated and where said certain period of time or said minimal number of serial clock pulses have to be chosen in such a way that a complete undisturbed read operation from said single-port RAM is guaranteed.

25. The method according to claim 24 wherein said step of generating said modified resulting read strobe signal further comprises:

generating two auxiliary signals named read block and read OK;

asserting said read block signal after said certain period of time after said first serial clock pulse is activated together with asserting said read OK signal when said serial clock pulse is activated; and clearing said read block signal and said read OK signal when said original read strobe signal is inactivated.

26. The method according to claim 1 wherein said step of generating said modified resulting read strobe signal comprises:

generating a write strobe signal at the end of said serial clock signal; and generating additional control signals in order to indicate ongoing read processes and in order to block read processes during ongoing write processes; and modifying the original read strobe signal with the help of said additional control signals in order to avoid memory access collisions in such a way, that incoming serial memory write accesses are always executed and successful read requests are performed before said write accesses.

27. The method according to claim 1 wherein said step of generating said modified resulting read strobe signal comprises:

generating a write strobe signal at the end of said serial clock signal; and generating additional control signals in order to indicate ongoing read processes and in order to block read processes during ongoing write processes; and modifying the original read strobe signal with the help of said additional control signals in order to avoid memory access collisions in such a way, that incoming serial memory write accesses are always executed and successful read requests are performed after said write accesses.

28. The method according to claim 1 wherein said step of generating said modified resulting read strobe signal comprises:

generating only one single resulting read strobe signal for every original read strobe signal applied, thus blocking the generation of more than one modified resulting read strobe signals out of the original read strobe signals, therefore reducing power consumption of the circuit during operation and to guarantee that a backplane counter of an LCD controller is only incremented once for each original read strobe signal.

29. A circuit for avoiding access collisions during read and write operations to a single-port RAM, wherein serial write access and asynchronous read access are used, comprising:

a serial interface, with a serial clock input terminal and serial data input and parallel output terminals;

an independent read device with a data input terminal and an original read strobe output terminal and means to deliver data as well as means for providing control signals;

a single-port RAM with a single data port for data input and output signals and a separate control port for input of a write strobe signal and a modified read strobe signal;

means to control the timing of said original read strobe signal from said independent read device for said asynchronous read access to said single-port RAM to avoid access collisions to said single-port RAM; and means to generate a modified resulting read strobe signal for said asynchronous read access to said single-port RAM such that simultaneous access of said read and write operations to said single-port RAM is avoided, whenever said serial write access and said asynchronous read access to said single-port RAM occur.

30. The circuit according to claim 29 further comprising:

means to provide a write strobe signal for said serial interface generated at the end of said serial clock signal or said serial write access to said single-port RAM; and means to use said write strobe signal as an input signal for said means to generate said modified resulting read strobe signal.

31. The circuit according to claim 30 further comprising:

a separate circuit block named Read Access Controller (RAC);

means to use as a first input signal said serial clock signal from said serial interface providing a first connection to the RAC from said serial interface;

means to use as a second input signal said write strobe signal from said serial interface providing a second connection to the RAC from said serial interface;

means to use as a third input signal said original read strobe signal from said independent read device providing a third connection to the RAC from said independent read device; and means to deliver as an output signal to said single-port RAM said modified resulting read strobe signal generated within the RAC thus providing a fourth connection from the RAC now to said single-port RAM.

32. The circuit according to claim 31 further comprising:

means to utilize an auxiliary read block signal, used for internal control of the read access by said modified resulting read strobe signal within said RAC together with means to utilize an auxiliary read OK signal, used also for internal control of the read access by said modified resulting read strobe signal within said RAC.

33. The circuit according to claim 29 further comprising:

a separate circuit block named Read Access Controller (RAC);

means to use as a first input signal said serial clock signal from said serial interface thus providing a first connection to the RAC from said serial interface;

means to use as a second input signal said original read strobe signal from said independent read device thus providing a second connection to the RAC now from said independent read device; and means to deliver as output signal to said single-port RAM said modified resulting read strobe signal generated within the RAC thus providing a third connection from the RAC now to said single-port RAM.

34. The circuit according to claim 33 further comprising:

means to utilize an auxiliary read block signal, used for internal control of the read access by said modified resulting read strobe signal within said RAC together; and means to utilize an auxiliary read OK signal, used also for internal control of the read access by said modified resulting read strobe signal within said RAC.

35. The circuit according to claim 33 further comprising:

means to use as a third input signal said write strobe signal from said serial interface providing a fourth connection to the RAC now from said serial interface.

36. The circuit according to claim 29 wherein said independent read device is an LCD controller.

37. The circuit according to claim 29 wherein said modified resulting read strobe signal is used as an input signal for a backplane counter of an LCD controller.

* * * * *

UNITED STATES PATENT AND TRADEMARK OFFICE
CERTIFICATE OF CORRECTION

PATENT NO. : 6,915,400 B2
DATED : July 15, 2005
INVENTOR(S) : Markus Engelhardt

It is certified that error appears in the above-identified patent and that said Letters Patent is hereby corrected as shown below:

<u>Title page,</u>
Item [75], Inventor, delete "Markus Engelahardt, Dettingen-Teck (DE)", and replace with -- Markus Engelhardt, Dettingen-Teck (DE) --.

Signed and Sealed this

First Day of November, 2005

JON W. DUDAS
*Director of the United States Patent and Trademark Office*